(12) United States Patent
Torunoglu et al.

(10) Patent No.: US 9,424,372 B1
(45) Date of Patent: Aug. 23, 2016

(54) SYSTEM AND METHOD FOR DATA PATH HANDLING, SHOT COUNT MINIMIZATION, AND PROXIMITY EFFECTS CORRECTION RELATED TO MASK WRITING PROCESS

(71) Applicant: D2S, Inc., San Jose, CA (US)

(72) Inventors: Ilhami H. Torunoglu, Monte Sereno, CA (US); Ahmet Karakas, Palo Alto, CA (US)

(73) Assignee: D2S, Inc., San Jose, CA (US)

( * ) Notice: Subject to any disclaimer, the term of this patent is extended or adjusted under 35 U.S.C. 154(b) by 31 days.

(21) Appl. No.: 13/843,175

(22) Filed: Mar. 15, 2013

Related U.S. Application Data

(60) Provisional application No. 61/658,329, filed on Jun. 11, 2012.

(51) Int. Cl.
*G03F 7/00* (2006.01)
*G06F 17/50* (2006.01)
*G03F 7/20* (2006.01)

(52) U.S. Cl.
CPC ............ *G06F 17/50* (2013.01); *G03F 7/70466* (2013.01)

(58) Field of Classification Search
CPC ............ G03F 7/70433; G03F 7/70058; G03F 7/70216
USPC .......................................... 716/100
See application file for complete search history.

(56) References Cited

U.S. PATENT DOCUMENTS

| | | | |
|---|---|---|---|
| 8,378,320 B2 * | 2/2013 | Platzgummer | 250/492.22 |
| 2011/0226968 A1 * | 9/2011 | Platzgummer | 250/492.3 |
| 2012/0017183 A1 * | 1/2012 | Ye et al. | 716/52 |
| 2012/0286170 A1 * | 11/2012 | Van De Peut et al. | 250/397 |

* cited by examiner

*Primary Examiner* — A. M. Thompson
(74) *Attorney, Agent, or Firm* — The Mueller Law Office, P.C.

(57) ABSTRACT

A system and method for mask data preparation (MDP) uses pixel processing algorithms running on parallel processing platforms such as central processing units (CPUs) and graphical processing units (GPUs). Proximity effects correlation, dose, and bias corrections are performed on a pixel basis. In some embodiments, striping of a decorated database in parallel using multiple graphic processors is performed. While performing a first light path simulation for a first stripe for a mask, a second light path simulation is performed for a second stripe for the mask. Using a result of the striping and first and second light path simulations, dose adjustment during a mask processing on a pixel of the mask is performed.

6 Claims, 1 Drawing Sheet

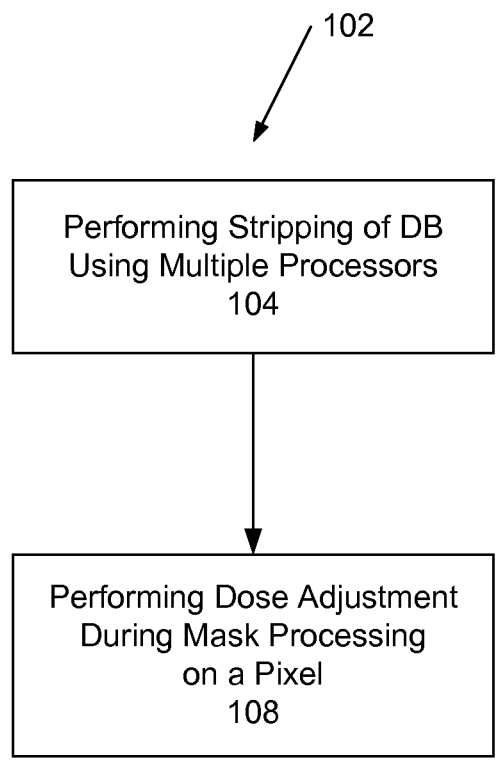

SYSTEM AND METHOD FOR DATA PATH HANDLING, SHOT COUNT MINIMIZATION, AND PROXIMITY EFFECTS CORRECTION RELATED TO MASK WRITING PROCESS

CROSS-REFERENCE TO RELATED APPLICATIONS

This patent application claims the benefit of U.S. patent application 61/658,329, filed Jun. 11, 2012, which is incorporated by reference along with all other references cited in the application.

BACKGROUND OF THE INVENTION

The present invention relates to the field of techniques for the process of photolithography mask writing.

Usually photomask data preparation and photomask writing is done in two steps:

(1) Fracture a decorated layout into simpler shapes such as rectangles and trapezoids; and (2) Correct for mask process effects: (a) Correction for proximity effects correction (PEC) (dose adjustment and/or biasing); (b) correction for mask making process; and (c) correction for mask etching process.

Both laser and electron beam lithography (i.e., e-beam lithography) fixed diameter mask writers have been in production for many years. Electron beam lithography is the practice of emitting a beam of electrons in a patterned fashion across a surface covered with a film, called the resist, and selectively removing either exposed or non-exposed regions of the resist, called developing. Edge-based real-time dose correction hardware/software systems have been used previously.

The primary electrons in the incident beam lose energy upon entering a material through inelastic scattering or collisions with other electrons.

Therefore, what is needed is an improved technique for preparing data for writing photomasks, especially for data path handling, shot count minimization, and proximity effects correction.

BRIEF SUMMARY OF THE INVENTION

A system and method for mask data preparation (MDP) system uses pixel processing algorithms running on parallel processing platforms such as central processing units (CPUs) and graphical processing units (GPUs). PEC, dose, and bias corrections are performed on pixel basis.

In our approach, there is no need to flatten a decorated database to smaller shapes. Only striping is needed. This can be done in parallel by GPUs. Hierarchical data processing offers less computation since only repeated tiles are to be stored. Bottom-up pattern search can be used to improve fidelity.

Some advantages of the present invention include: (1) avoids fracturing each shape; (2) task such as PEC and biasing can be simultaneously performed on each pixel while being rendered; (3) avoids conversion from OASIS/GDSII to MEBES/OASIS.vsb formats; (4) avoids storage information for each primitive such as dose and bias; (5) avoids performing OR operations on vector data; and (6) avoids sorting vector data since it can be mapped directly to pixels.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 shows a flow diagram of a flow (102) including performing striping of a database (104) and performing dose adjustment during mask processing (108).

DETAILED DESCRIPTION OF THE INVENTION

Lithographic photomasks are typically transparent fused silica blanks covered with a pattern defined with a chrome metal-absorbing film. Photomasks are used at wavelengths of 365 nanometers, 248 nanometers, and 193 nanometers. Photomasks have also been developed for other forms of radiation such as 157 nanometers, 13.5 nanometers (EUV), X-ray, electrons, and ions, but these require entirely new materials for the substrate and the pattern film.

A set of photomasks, each photomask defining a pattern layer in integrated circuit fabrication, is fed into a photolithography stepper or scanner, and individually selected for exposure. In double patterning techniques, a photomask would correspond to a subset of the layer pattern.

Electron beam lithography (often abbreviated as e-beam lithography) is the practice of emitting a beam of electrons in a patterned fashion across a surface covered with a film, called the resist, and selectively removing either exposed or non-exposed regions of the resist, called developing. The purpose is to create very small structures in the resist that can subsequently be transferred to the substrate material, often by etching.

Electron beam lithography systems can be classified according to both beam shape and beam deflection strategy. Older systems used Gaussian-shaped beams and scanned these beams in a raster fashion. Newer systems use shaped beams, which may be deflected to various positions in the writing field, also known as vector scan.

Electron energy deposition in matter. The primary electrons in the incident beam lose energy upon entering a material through inelastic scattering or collisions with other electrons. In such a collision, the momentum transfer from the incident electron to an atomic electron can be expressed as $dp = 2e(^2)/bv$ where b is the distance of closest approach between the electrons, and v is the incident electron velocity. The energy transferred by the collision is given by $T = (dp)(^2)/2m = e(^4)/Eb(^2)$ where m is the electron mass and E is the incident electron energy, given by $E = (½)mv(^2)$. By integrating over all values of T between the lowest binding energy ($E_0$) and the incident energy, one obtains the result that the total cross section for collision is inversely proportional to the incident energy E, and proportional to $1/E_0 - 1/E$. Generally, $E > E_0$, so the result is essentially inversely proportional to the binding energy.

By using the same integration approach, but over the range $2E_0$ to E, one obtains by comparing cross-sections that half of the inelastic collisions of the incident electrons produce electrons with kinetic energy greater than $E_0$. These secondary electrons are capable of breaking bonds with binding energy $E_0$ at some distance away from the original collision. Additionally, they can generate additional, lower energy electrons, resulting in an electron cascade. Hence, it is important to recognize the significant contribution of secondary electrons to the spread of the energy deposition.

In general, for a molecule AB:

This reaction, also known as "electron attachment" or "dissociative electron attachment" is most likely to occur after the electron has essentially slowed to a halt, since it is easiest to capture at that point. The cross-section for electron attachment is inversely proportional to electron energy at high energies, but approaches a maximum limiting value at zero energy. On the other hand, it is already known that the mean free path at the lowest energies is well over 10 nanometers, thus limiting the ability to consistently achieve resolution at this scale.

Scattering. In addition to producing secondary electrons, primary electrons from the incident beam with sufficient energy to penetrate the photoresist can be multiple-scattered over large distances from underlying films and/or the substrate. This leads to exposure of areas at a significant distance from the desired exposure location. For thicker electrons, as the primary electrons move forward, they have an increasing opportunity to scatter laterally from the beam-defined location. This scattering is called forward scattering. Sometimes the primary electrons are scattered at angles exceeding 90 degrees (i.e., they no longer advance further into the resist). These electrons are called backscattered electrons and have the same effect as long-range flare in optical projection systems. A large enough dose of backscattered electrons can lead to complete exposure of resist over an area much larger than defined by the beam spot.

Proximity effect. The smallest features produced by electron beam lithography have generally been isolated features, as nested features exacerbate the proximity effect, whereby electrons from exposure of an adjacent region spill over into the exposure of the currently written feature, effectively enlarging its image, and reducing its contrast (i.e., the difference between maximum and minimum intensity). Hence, nested feature resolution is harder to control. For most resists, it is difficult to go below 25 nanometers lines and spaces, and a limit of 20 nanometers lines and spaces has been found. In reality though, the range of secondary electron scattering is quite far, sometimes exceeding 100 nanometers, but becoming very significant below 30 nanometers.

The proximity effect is also manifest by secondary electrons leaving the top surface of the resist and then returning some tens of nanometers distance away.

Proximity effects due to electron scattering can be addressed by solving the inverse problem and calculating the exposure function $E(x,y)$ that leads to a dose distribution as close as possible to the desired dose $D(x,y)$ when convolved by the scattering distribution point spread function $PSF(x,y)$. However, it must be remembered that an error in the applied dose, for example from shot noise, would cause the proximity effect correction to fail.

Charging. Since electrons are charged particles, they tend to charge the substrate negatively unless they can quickly gain access to a path to ground. For a high-energy beam incident on a silicon wafer, virtually all the electrons stop in the wafer where they can follow a path to ground. However, for a quartz substrate such as a photomask, the embedded electrons will take a much longer time to move to ground. Often the negative charge acquired by a substrate can be compensated or even exceeded by a positive charge on the surface due to secondary electron emission into the vacuum. The presence of a thin conducting layer above or below the resist is generally of limited use for high energy electron beams, since most electrons pass through the layer into the substrate. The charge dissipation layer is generally useful only around 10 kiloelectron volts since the resist is thinner and most of the electrons either stop in the resist or close to the conducting layer. However, they are of limited use due to their high sheet resistance, which can lead to ineffective grounding.

The range of low-energy secondary electrons which can contribute to charging is not a fixed number but can vary from 0 to as high as 50 nanometers. Hence, resist-substrate charging is not repeatable and is difficult to compensate consistently. Negative charging deflects the electron beam away from the charged area while positive charging deflects the electron beam toward the charged area.

Typical mask writing data requirements. Typically, it is desirable to write 1 millimeter×1 millimeter mask area in one second or less. If this information is delivered on a pixel basis with 5 nanometers by 5 nanometers pixels, at least 40 gigapixels per second, or at least 160 gigabits per second mask data preparation throughput is necessary. Similarly, 4 gigabytes per second rasterizer throughput is necessary to support a practical mask writing system.

Usually mask data preparation/mask writing is done in two steps:

(1) Fracture a decorated layout into simpler shapes such as rectangles and trapezoids; and (2) Correct for mask process effects: (a) Correction for PEC (dose adjustment and/or biasing); (b) Correction for mask making process; and (c) Correction for mask etching process.

In a typical embodiment, several hundred megabytes per second polygon information needs to be processed, representing 50 million rectangles. The rasterization process (i.e., polygon painting) outputs 160 gigabits per second, or 20 gigabytes per second data. A multiplicity of CPU/GPUs, such as 12 of them used in parallel, is sufficient to handle this traffic.

Our approach is a pixel-based MDP approach. Both laser and e-beam fixed diameter mask writers have been in production for many years. Edge-based real-time dose correction hardware/software systems have been used previously. In our method, PEC, dose and bias corrections are performed on pixel basis.

In our approach, there is no need to flatten a decorated database to smaller shapes. Only striping is needed. This can be done in parallel by GPUs. Hierarchical data processing offers less computation since only repeated tiles are to be stored. Bottom-up pattern search can be used to improve fidelity.

Some advantages of the approach include:

(1) Avoids fracturing each shape.

(2) Task such as PEC and biasing can be simultaneously performed on each pixel while being rendered.

(3) Avoids conversion from OASIS/GDSII to MEBES/OASIS.vsb formats.

(4) Avoids storage information for each primitive such as dose and bias.

(5) Avoids performing OR operations on vector data.

(6) Avoids sorting vector data since it can be mapped directly to pixels

Algorithm. For each iteration, the following tasks are typically performed:

(1) Light path simulation (typically requires about 40 Gaussian for PEC simulation).

(2) Multi-layer resist simulation (1 or 2 Gaussians are typically needed for masks).

(3) Process simulation (resist development).

(4) Etch modeling.

(5) Contour generation.

(6) Die-to-database computation.

Convolutions on GPUs or CPUs, or both, by using truncated Fourier coefficients-based Fast Fourier Transform (FFT). Fourier series of Slow Varying Gaussian Function which concentrates on a few low frequency elements. For example, when sigma=20 micrometers, the 5×5=25 FFT coefficients contain 99.84 percent of the energy. This means only 25 FFT coefficients are needed for enough accuracy.

Heating and density related computations. Since we previously compute FFT of the tile, the DC component of the tile is the density term (i.e., zero computation cost for density). Heating corrections can be done since we know the scanning directions.

Edge Biasing by using pixel domain morphing. The present invention includes a pixel domain morphing functionality to manipulate mask pixels to compensate for mask writer or process related issues such as etch biasing. In a specific implementation, omni-directional shape modification functions are used. For example:

Bloat=Dilation

Shrink=Erosion

In another implementation, we use directional shape modification functions on any given pattern morphing which provides more flexibility.

In addition to shape forming, special treatments for corners can be applied by using pixel-based corner detection or shape-based corner tagging approaches.

Resist development modeling and computations. The present invention includes using an accurate resist model to predict actual shapes that are printed on the mask. Our pixel-based resist model includes the chemical resist development stages.

Our resist model can also be simplified to a thresholding operation. To obtain a sub-pixel accuracy, directional information as well as interpolation using several pixels are used.

In a specific implementation, 2 pixels are used to for a linear interpolation. Our experiments indicate that a cubic interpolation using 4 pixels suffice for an accuracy of 0.03 nanometer.

In order to predict the sensitivity of the generated mask to manufacturing variations, multiple thresholds representing multiple process conditions are generated. This information is used to determine the pixel correction values to improve the mask accuracy.

Shot Count Minimization and Shot Overlapping. Our approach to shot overlapping and ensuring shot count minimization during mask writing process is based on finding a constant factor approximation algorithm for the rectangle cover problem.

Customarily, one thinks of the polygon P as a union of infinitely many (combinatorial) pixels, sometimes also called a polyomino. The polygon P can be associated with a visibility graph G. The vertex set of G is the set of pixels of P and two vertices are adjacent in G if and only if their associated pixels can be covered by a common rectangle. Rectangles correspond to cliques in G. A clique is a set of vertices, any two of which are adjacent.

For polygons with holes and even for those without holes (also called simple polygons) the rectangle cover problem is NP-hard. In particular this implies that there is no polynomial time approximation scheme. Since the rectangle cover problem is a special set cover problem, the standard greedy approach immediately gives an O(log n) approximation. A constant factor approximation in the general case can be considered as the remaining white spot in the problem's complexity landscape.

We represent the rectangle cover problem as an integer programming. Interpreting rectangles as cliques in G we can make use of the standard integer programming formulation for the minimum clique cover problem in graphs. A binary variable x indicates whether rectangle r is chosen in the cover or not. For every pixel p at least one rectangle which covers p has to be picked, and the number of picked rectangles has to be minimized.

This integer program allows us to optimally solve any given instance of our problem. In our case the number of variables and constraints is polynomial, in fact, a quadratic, due to the fact that we work with maximal rectangles only.

The integer program immediately generalizes to the weighted rectangle cover problem, where rectangles need not have unit cost. It is straightforward, and it does not increase the complexity, to restrict the coverage requirement to particular features of the polygon like the corners or the boundary. It is also no coincidence that a formal dualization leads to a formulation for the dual problem of handling a maximum stable set. A binary variable yp reflects whether a pixel is chosen in the stable set or not. We have to require that no rectangle contains more than one of the chosen pixels, and we maximize the number of chosen pixels. This is called the dual integer program.

Linear programming-based approximation. There are linear programming (LP) based approaches to constant factor approximation algorithms. They are used as analytical tools to improve the accuracy of computational methods.

Iterated Rounding. In standard LP rounding of all the fractional variables the approximation factor hinges on the magnitude of the smallest fraction. Alternatively, it is an option to: (1) Round up only one fractional variable at a time; (2) adapt the linear program to reflect the rounding; (3) solve the modified linear program again; and (4) iterate.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:

performing a striping of a decorated database in parallel using multiple graphic processors;

performing a first light path simulation for a first stripe for a mask using a first graphic processor;

while performing the first light path simulation, performing a second light path simulation for a second stripe for the mask using a second graphics processor;

using a result of the striping and first and second light path simulations, performing dose adjustment during a mask processing on a pixel of the mask; and performing one of the following methods, selected from the group consisting of:

a) performing a first resist simulation for the first stripe using a third graphic processor, and while performing the first resist simulation, performing a second resist simulation for the second stripe using a fourth graphics processor;

b) performing a first etch modeling simulation for the first stripe using the third graphic processor, and while performing the first etch modeling simulation, performing a second etch modeling simulation for the second stripe using the fourth graphic processor; and c) performing a first contour generation for the first stripe using the third graphic processor, and while performing the first contour generation, performing a second contour generation for the second stripe using the fourth graphic processor.

2. A method comprising:

performing a striping of a decorated database in parallel using multiple graphic processors;

performing a first light path simulation for a first stripe for a mask using a first graphic processor;

while performing the first light path simulation, performing a second light path simulation for a second stripe for the mask using a second graphics processor; and using a result of the striping and first and second light path simulations, performing dose adjustment during a mask processing on a pixel of the mask, wherein the performing a first light path simulation for a first stripe using a first graphic processor comprises:

computing a convolution using truncated Fourier coefficients-based Fast Fourier Transform.

3. The method of claim 2 wherein for a sigma of 20 microns, 25 or fewer Fast Fourier Transform coefficients are used.

4. A method comprising:

performing a striping of a decorated database in parallel using multiple graphic processors;

performing a first light path simulation for a first stripe for a mask using a first graphic processor;

while performing the first light path simulation, performing a second light path simulation for a second stripe for the mask using a second graphics processor; and using a result of the striping and first and second light path simulations, performing dose adjustment during a mask processing on a pixel of the mask, wherein the performing dose adjustment during a mask processing on a pixel comprises:

representing a rectangle as an integer programming, where for every pixel p at least one rectangle which covers p has to be picked.

5. The method of claim 4 comprising:

computing the integer programming comprises:

rounding up only one fractional variable at a time;

adapting the programming to reflect the rounding; or solving a modified linear program.

6. The method of claim 4 wherein each rectangle contains more than one selected pixel.

* * * * *